United States Patent
Dubois et al.

[11] 4,385,797
[45] May 31, 1983

[54] LIGHT-EMITTING DEVICE COUPLED TO AN OPTICAL FIBRE

[75] Inventors: Jean-Claude Dubois; Gerard Mourgues, both of Caen, France

[73] Assignee: U.S. Philips Corporation, New York, N.Y.

[21] Appl. No.: 160,704

[22] Filed: Jun. 18, 1980

[30] Foreign Application Priority Data

Jun. 20, 1979 [FR] France .................... 79 15841

[51] Int. Cl.³ .................................. G02B 5/14
[52] U.S. Cl. ........................................ 350/96.2
[58] Field of Search ............... 350/96.2, 96.21, 96.22

[56] References Cited

U.S. PATENT DOCUMENTS 4,166,672  9/1979  Gilbert ........................ 350/96.2
4,184,741  1/1980  Hawk et al. .................. 350/96.2

FOREIGN PATENT DOCUMENTS 2602661  7/1977  Fed. Rep. of Germany.

*Primary Examiner*—Eli Lieberman
*Attorney, Agent, or Firm*—Marc D. Schechter

[57] ABSTRACT

Optical fiber communication systems require a light source to be coupled to a fiber with good alignment, with low risk of fiber breakage, and with a hermetic seal of around the coupling zone. Elastically deformable clamping and sealing rings around the fiber and within a metal sleeve housing the source are known. The invention employs two soft deformable rings spaced apart by a rigid bushing. The rings have conical surfaces compressed between corresponding conical surfaces in the sleeve. Axial alignment of the fiber is achieved with a minimum of interfaces to obtain a good seal.

9 Claims, 3 Drawing Figures

LIGHT-EMITTING DEVICE COUPLED TO AN OPTICAL FIBRE

BACKGROUND OF THE INVENTION

The present invention is concerned with a light-emitting device coupled to an optical fiber. The light-emitting device is an essentially Lambertian source of emission on the surface of a semiconductor crystal mounted on a base. The receiving end of at least one optical fiber is held in position in front of the emitter with the aid of two flexible rings fitted in a cavity in a metal sleeve. The rings, sleeve, and base together form an air-tight protective container having an axial passage through which the optical fiber passes.

It is known in the field of telecommunications that certain electrical coaxial connections can be replaced by optical connections with the aid of optical fibers placed in a suitable envelope and interconnecting a light-emitting source and a light-receiver. These optical fibers, consisting of a cylindrical core and a sheath with a refractive index different from that of the core, in fact offer the advantage of being insensitive to unwanted external interference. They also have a lower attenuation coefficient than traditional coaxial cables, so that they can be used in high frequency ranges on the order of gigahertz.

A single fiber is generally used to form an optical connection. It is either single-mode when it operates with very directional and coherent source of radiation, it is multimode when the source is not monochromatic. Nevertheless, in certain cases, particularly for reasons of security in transmission, a number of fibers may be grouped into a bundle in an envelope to form an optical connection.

The use of an optical fiber or a bundle of optical fibers nevertheless presents a certain number of difficulties, particularly with regard to its or their coupling to the source of emission.

It is known that the angle of acceptance of an optical fiber does not exceed 10° generally. Consequently, if the source of emission is highly directional, such as a laser, its coupling with the fiber can be satisfactorily effected. However, if the source of emission radiates into space essentially according to Lambert's law (a Lambertian source), only a small quantity of the light emitted by the source is able to enter the fiber.

In most applications, the sources of emission used are light-emitting diodes formed on the surface of a semiconductor crystal. These diodes transmit light from that surface either directly to the outside, or indirectly after passing through the material composing the crystal. The light is emitted according to a law comparable to Lambert's law. to ensure optimum transmission of data, it is therefore desirable to maximizing the light entering the fiber, or the bundle of fibers, and therefore to exercise the greatest care in centering the source of emission and fixing its distance in relation to the receiving face of the fiber or bundle of fibers. The severity of this problem increases as the cross-section of the receiving face of the fiber or of the bundle of fiber becomes smaller than the surface of the source of emission.

The mutual centering and the maintenance in position of the source of emission and of the fiber or the bundle of fibers may be effected by a well-known procedure which consists principally in fixing the source of emission on a base and applying a radial pressure to the fiber or bundle of fibers with the aid of, for example, at least one flexible and elastic ring.

The best known means of applying this radial pressure to the ring are relatively varied. One of the simplest of these known means consists of inserting the ring in a nondeformable housing of configuration and dimensions essentially identical to the configuration and external dimensions of the ring. By now applying to the ring a pressure in the longitudinal direction, since the housing is nondeformable the ring necessarily undergoes a centripetal deformation.

This deformation must be sufficient to keep the optical fiber in place but must not cause the fiber to crack or break.

This clamping problem, which is complicated with even a single ring, becomes more difficult to resolve when there are several rings placed at the end of the fiber to ensure that it is optimally centered.

In fact, the existence of several clamping points means that the radial pressure applied to the optical fiber should be equally distributed between them so as to avoid internal deformation of the crystal structure of the fiber or even its breakage. This problem becomes more acute as the diameter of the fiber becomes smaller.

A solution recently proposed by the applicants in French patent application No. 79 11 451, consists in clamping the end of the optical fiber in a rigid sleeve which is itself subjected to the radial pressure exerted by the flexible and elastic rings.

This solution requires some care and precision in the positioning of the sleeve and in the insertion of the assembly in the rings, each previously inserted in a housing hollowed out inside a metal sheath.

Furthermore, certain applications may necessitate hermetically sealing the device against ambient atmospheric or chemical agents. However, a sequence of rings or tubes of various natures means as many successive interfaces which, in the event of a fault, however slight, may contribute to the occurrence of leaks.

SUMMARY OF THE INVENTION

An object of the present invention is to provide a simple and effective optical coupling device which can be rapidly implemented and which is suitable for various kinds of optical fibers, particularly small-diameter optical fibers.

The invention provides a light emitting device coupled to an optical fiber comprising an essentially Lambertian source of emission on the surface of a semiconductor crystal mounted on a base. At least one optical fiber, whose end is adapted to receive the radiation emitted by the source of emission, is held in position by two flexible rings fitted into a cavity in a metal sleeve. The metal sleeve and the base form a protective airtight case having an axial passage through which the fiber passes. The rings each have a conical portion, the first ring fitting into one end of the cavity which has been given an essentially identical shape and the second ring fitting into a corresponding conical recess formed in a movable end fitting which slides freely in the cavity in the metal sleeve. The non-conical portions of the two rings face each other and are separated by a rigid bushing. The rings are compressible against the end of the cavity in the metal sleeve so as to immobilize the optical fiber in the appropriate position by means of a clamping ring inserted in the sleeve and pressing on the movable end fitting.

The assembly formed by the two flexible rings, the bushing and the clamping ring is used for placing the optical fiber essentially on the axis of the metal sleeve and for essentially hermetically sealing the fiber in the sleeve. The fiber is subsequently aligned with and spaced from the source of emission by other means.

The source of emission and the end of the optical fiber enclosed in the protective housing formed by the substrate and the metal sleeve form a fixed and preset subassembly which can be used to advantage to form a connector.

To improve the efficiency of transmission still further, and according to a preferred mode of implementation of the invention, the distance between the semiconductor crystal and the receiving end of the optical fiber is occupied by a transparent resin with a refractive index equal to that of the core of the fiber.

The dimensions of the flexible rings and their housing in the sleeve, and also those of the rigid bushing, having been suitably chosen in advance, placing the end of the fiber in relation to the source of emission at the appropriate lateral position and at the appropriate distance is ensured by a simple operation providing sufficient guarantee of precision.

The substrate carrying the source of emission, and the metal sleeve are generally cylindrical. Advantageously, all the main elements in the subassembly may also be cylindrical.

It is advantageous if the clamping ring acting on the movable end fitting is a threaded ring screwing into the wall of the cavity of the metal sleeve.

The source of emission in the optical device according to the invention may be a light-emitting diode made from a Group III–V compound.

In a first embodiment of the invention the flexible rings are made of a polymerized synthetic material such as polyamide, tetrafluorethylene or acetal, with the bushing being made preferably of iron-nickel and the sleeve of nickel.

In a second embodiment the flexible rings may be of a deformable metal such as tin, lead, indium or gold or of an alloy comprising, inter alia, at least one of those materials.

The present invention also provides a process for implementing the optical coupling, in which the end of an optical fiber is inserted in the cavity of a metal sleeve having at one end a first flexible ring separated from a second flexible ring by a rigid bushing. Each of the rings comprises at least one conical part. After the receiving end of the fiber has been placed through and at the desired distance from the rings, a movable end fitting and a clamping ring are inserted successively into the cavity. Finally, the sleeve is fixed on a base which is at least partly of metal and holds the source of emission which is connected electrically to the outside by output terminals.

The longitudinal positioning of the optical fiber in the sleeve is carried out with the aid of a gauge placed flat against the receiving end of the fiber in order to precisely set the distance between the receiving end and the source of emission. The alignment of the source of emission with the receiving end of the fiber, already partially achieved by centering the fiber in the metal sleeve during the clamping of the flexible rings, is improved further by lateral adjustment of the base relative to the sleeve before the latter is fixed in position. This adjustment is achieved by suitable means. It is, for example, possible to use a light-receiver coupled to the other end of the optical fiber, which receives the light from the source of emission when the latter is operated. The best adjustment corresponds to the maximum light received.

It is advantageous if, before the receiving end of the optical fiber and the semiconductor crystal carrying the source of emission are aligned, a drop of polymerizable transparent resin with a refractive index equal to that of the core of the fiber is deposited on the end of the fiber.

The optical fiber generally consists of a core and a cladding both of transparent substances such as glass but with different refractive indices. The fiber is covered with a protective coating of an opaque plastic material. Also, the flexible rings may be made either of a synthetic material or of a soft metal.

Consequently, in a first embodiment of the process corresponding to the case in which the rings are of synthetic material, it is preferable to keep the plastic coating of the fiber at least within the rings.

In a second embodiment of the process corresponding to the case in which the rings are of a soft deformable metal, it is preferable to eliminate the protective coating of the fiber at least within the rings.

Both embodiments of the process are prompted by the desire to ensure a hermetic seal.

The description which follows, taken in conjunction with the appended drawings, which are given by way of indication only and are not exhaustive, will facilitate the comprehension of what constitutes the invention.

It should be noted that the dimensions in the figures are considerably exaggerated and are not in proportion, the aim being to make the drawings clear.

DESCRIPTION OF THE PREFERRED EMBODIMENTS

Figure 1:
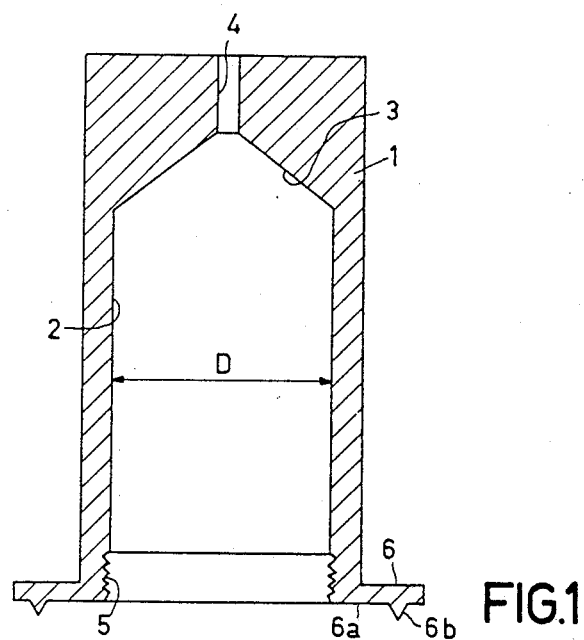
FIGS. 1 and 2, respectively, are cross-sectional views of embodiments of the metal sleeve and the rings forming part of the invention.

As FIG. 1 shows, the metal sleeve 1, which forms a portion of the protective housing of the optical device, contains a cavity 2. End 3 of cavity 2 has a conical configuration. Cavity 2 is generally cylindrical in shape.

An axial passage 4 connects end 3 of cavity 2 to the outside of sleeve 1. An optical fiber can be passed through passage 4. End 5 of the cavity 2, opposite to end 3, is threaded over a predetermined distance. Towards this same end 5, the metal sleeve ends in a shoulder 6 which has on its surface 6a a continuous ridge 6b which is essentially triangular in section.

Figure 2:
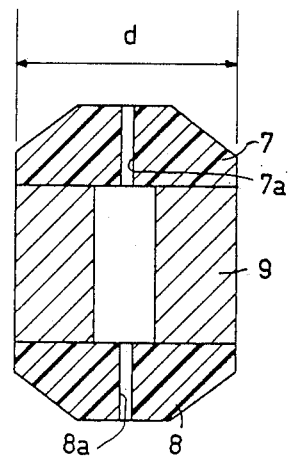

The metal sleeve 1 will preferably be made of nickel but might be made from any other metal which is sufficiently rigid, is not porous, and which can adhere to the substrate which will carry the source of emission. Referring to FIG. 2, flexible rings 7 and 8, separated by a bushing 9, will be inserted in cavity 2 of the sleeve 1 upon assembling the optical coupling. Rings 7 and 8 have the shape of a truncated cone, the cone angle of ring 7 being essentially identical to that of end 3 of cavity 2 in sleeve 1.

The rings 7 and 8 may be made from a polyamide such as that known under the trade name of "nylon", or of tetrafluoroethylene, or preferably from an acetal resin such as, in particular, that known under the trade name to "Delrin". They may also be made from a deformable soft metal, chosen either singly or in any combination, from the series comprising tin, lead, indium and gold.

Bushing 9 is made of iron-nickel and forms a tube whose external diameter, d, is essentially equal to diameter, D, of the cylindrical portion of cavity 2 of metal sleeve 1.

Figure 3:
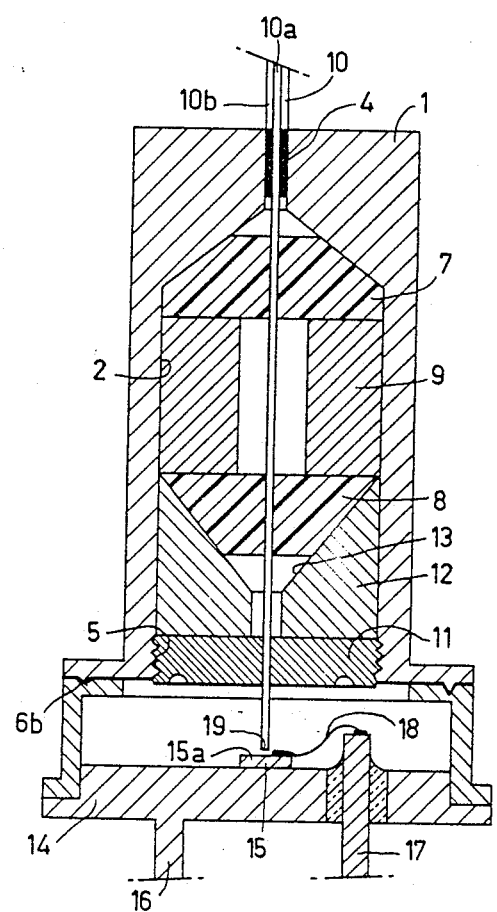
FIG. 3 shows schematically and in cross-section an entire optical coupling device according to the invention.

FIG. 3 shows the construction of an optical device embodying the invention. The optical device comprises an optical fiber 10 consisting of a cladding and a core of transparent substances with different refractive indices. The cladding and the core are represented in the fiber by a single reference 10a. This fiber 10 is covered with a protective coating 10b of an opaque plastic.

In the example chosen, in which the flexible rings 7 and 8 are of soft metal, the fiber has been stripped of its coating 10b over the portion which has to be introduced into metal sleeve 1.

The optical fiber 10 introduced into sleeve 1 via passage 4 is clamped by means of rings 7 and 8, which are separated by bushing 9. The pressure exerted on the rings 7 and 8 is obtained by tightening a threaded clamping ring 11 in threaded portion 5 of cavity 2. The ring 11 rests on a movable end fitting 12 containing a conical recess 13 with a cone angle essentially identical to that of ring 8.

When ring 11 is tightened, the axial pressure undergone by ring 7 against end 3 of cavity 2 and by ring 8 immobilized between bushing 9 and end fitting 12 is partly transformed into radial pressure which causes a radial deformation of the rings. This deformation, which can only take place in holes 7a and 8a in the rings, causes the optical fiber 10 to be clamped in a position determined in advance with the aid of a gauge.

After positioning optical fiber 10 in sleeve 1, the sleeve is placed vertically against a metallic base 14 carrying the source of emission 15 and incorporating output terminals 16 and 17.

With the aid of the source of emission, 15 and of a light-receiver connected to the output end of the optical fiber opposite the receiving end 19, it is possible to determine the optimum site for the sleeve 1 on the base. Once this site has been determined, the sleeve 1 can be fixed permanently to the base, preferably by crimping ridge 6b.

In the example chosen, the source of emission 15 is preferably a light-emitting diode radiating from its acitve surface 15a in accordance with Lamert's law. Diode 15 comprises two regions with opposite types of conduction, one of which is connected directly by the base to output terminal 16 and the other to output 17 (insulated from the base) via a wire 18.

This diode may consist of, for example, a semiconductor crystal made from a III-V compound.

Additionally, the optical connection between the receiving end 19 of fiber 10 and the source of emission 15 can be improved by applying a drop of transparent polymerizable resin (not shown in FIG. 3) with a refractive index equal to that of the core of fiber 10. This drop will, in that case, preferably be deposited on the end 19 of fiber 10 before it is lined up with surface 15a of crystal 15.

What is claimed is:

1. A device for coupling an end of an optical fiber to a light source, said coupling device comprising:

a sleeve having a cavity with first and second ends, the first end having a conical shape widening toward the second end;

a movable end fitting, slideably arranged in the second end of the cavity, said end fitting having a conical recess widening toward the first end of the cavity;

a first flexible ring having a conical portion substantially the same shape as the first end of the cavity, said first ring being arranged in the cavity with its conical portion adjacent the first end of the cavity;

a second flexible ring having a conical portion substantially the same shape as the conical recess in the end fitting, said second ring being arranged in the cavity with its conical portion adjacent the conical recess in the end fitting;

a rigid bushing, arranged in the cavity between the flexible rings; and a clamping ring arranged in the cavity adjacent to the movable end fitting so as to press the movable end fitting toward the first end of the cavity;

said sleeve, end fitting, rings, and bushing defining an axial passage for directly accommodating the end of the optical fiber, the flexible rings immobilizing the end of the fiber when they are compressed between the sleeve and the clamping ring.

2. A device for hermetically coupling an end of an optical fiber to an essentially Lambertian light source, said light source comprising a semiconductor crystal mounted on a base, said coupling device comprising:

a metal sleeve having a cavity with first and second ends, the first end having a conical shape widening toward the second end;

a movable end fitting, slidably arranged in the second end of the cavity, said end fitting having a conical recess widening toward the first end of the cavity;

a first flexible ring having a conical portion substantially the same shape as the first end of the cavity, said first ring being arranged in the cavity with its conical portion adjacent the first end of the cavity;

a second flexible ring having a conical portion substantially the same shape as the conical recess in the end fitting, said second ring being arranged in the cavity with its conical portion adjacent the conical recess in the end fitting;

a rigid bushing, arranged in the cavity between the flexible rings; and a clamping ring arranged in the cavity adjacent to the movable end fitting so as to press the movable end fitting toward the first end of the cavity;

said sleeve, end fitting, rings, and bushing defining an axial passage for directly accommodating the end of the optical fiber, the flexible rings immobilizing the end of the optical fiber when they are compressed between the sleeve and clamping ring; and said base is attached to said sleeve, and said sleeve, flexible rings and base define a hermetically sealed chamber for the light source and the end of the optical fiber.

3. A device as claimed in claim 2, characterized in that:

the optical fiber has a core having a refractive index; and a transparent resin, having a refractive index equal to that of the core, is provided between the end of the optical fiber and the light source.

4. A device as claimed in claim 3, characterized in that the sleeve, the end fitting, the rings, the bushing, and the base are all cylindrical in shape.

5. A device as claimed in claim 4, characterized in that the second end of the sleeve has internal threads, and the clamping ring has mating threads for screwing the clamping ring into the sleeve.

6. A device as claimed in claim 5, characterized in that the bushing is made of iron-nickel, the sleeve is made of nickel, and the flexible rings are made of a polymerized synthetic material.

7. A device as claimed in claim 6, characterized in that the synthetic material is selected from the group consisting of polyamids, tetrafluoroethylene, and acetal resins.

8. A device as claimed in claim 5, characterized in that the bushing is made of iron-nickel, the sleeve is made of nickel, and the flexible rings are made of a deformable soft metal.

9. A device as claimed in claim 8, characterized in that the deformable soft metal is selected from the group consisting of tin, lead, indium and gold.

* * * * *